US012604545B2

(12) United States Patent
Huang

(10) Patent No.: US 12,604,545 B2
(45) Date of Patent: Apr. 14, 2026

(54) PHOTO DIODE WITH DUAL BACKSIDE DEEP TRENCH ISOLATION DEPTH

(71) Applicant: Taiwan Semiconductor Manufacturing Company, Ltd., Hsin-Chu (TW)

(72) Inventor: Yimin Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 511 days.

(21) Appl. No.: 18/177,216

(22) Filed: Mar. 2, 2023

(65) Prior Publication Data
US 2023/0207582 A1 Jun. 29, 2023

Related U.S. Application Data

(63) Continuation of application No. 17/070,543, filed on Oct. 14, 2020, now Pat. No. 11,600,644, which is a
(Continued)

(51) Int. Cl.
H10F 39/00 (2025.01)
(52) U.S. Cl.
CPC ....... H10F 39/8023 (2025.01); H10F 39/014 (2025.01); H10F 39/8037 (2025.01)
(58) Field of Classification Search
CPC . H10F 39/014; H10F 39/8023; H10F 39/8037
See application file for complete search history.

(56) References Cited

U.S. PATENT DOCUMENTS 7,936,036 B2 5/2011 Tanaka et al.
8,581,174 B2 11/2013 Dai et al.
(Continued)

FOREIGN PATENT DOCUMENTS

| CN | 109103211 A | * | 12/2018 | ............ H10F 39/011 |
| KR | 20190110228 A | * | 9/2019 | ........... H04N 13/254 |
| WO | WO-2019111373 A1 | * | 6/2019 | ............. H04N 25/70 |

OTHER PUBLICATIONS

JEDEC Solid State Technology Association. Definition of Floating Diffusion. The date of publication is unknown. Retrieved online on Nov. 5, 2018 from https://www.jedec.org/standards-documents/dictionary/terms/floating-region-floating-diffusion.
(Continued)

*Primary Examiner* — Matthew E Warren
(74) *Attorney, Agent, or Firm* — Eschweiler & Potashnik, LLC

(57) ABSTRACT
In some embodiments, the present disclosure relates to an image sensor, including a first photodiode and a second photodiode disposed in a semiconductor substrate. A floating diffusion node is disposed along a frontside of the semiconductor substrate and between the first and second photodiodes. A partial backside deep trench isolation (BDTI) structure is disposed within the semiconductor substrate and between the first and second photodiodes. The partial BDTI extends from a backside of the semiconductor substrate and is spaced from the floating diffusion node. A full BDTI structure extends from the backside of the semiconductor substrate to the frontside of the semiconductor substrate.

20 Claims, 12 Drawing Sheets

Related U.S. Application Data continuation of application No. 16/364,508, filed on Mar. 26, 2019, now Pat. No. 10,854,647.

(60) Provisional application No. 62/773,324, filed on Nov. 30, 2018.

(56) References Cited

U.S. PATENT DOCUMENTS

| | | | |
|---|---|---|---|
| 2007/0158771 A1 | 7/2007 | Hynecek | |
| 2011/0204467 A1 | 8/2011 | Ohchi et al. | |
| 2012/0190168 A1 | 7/2012 | Kao | |
| 2013/0134520 A1 | 5/2013 | Maeda et al. | |
| 2013/0307104 A1 | 11/2013 | Tsai et al. | |
| 2014/0141779 A1 | 5/2014 | Yuk et al. | |
| 2015/0130009 A1* | 5/2015 | Eikyu | H10F 39/803 |
| | | | 257/431 |
| 2015/0380447 A1 | 12/2015 | Chou et al. | |
| 2017/0263657 A1 | 9/2017 | Chu et al. | |
| 2018/0350856 A1 | 12/2018 | Masagaki et al. | |
| 2020/0091212 A1 | 3/2020 | Park et al. | |
| 2020/0135779 A1* | 4/2020 | Takahashi | H10F 39/8053 |
| 2023/0033933 A1* | 2/2023 | Uchida | H10F 39/8053 |

OTHER PUBLICATIONS

Tournier et al. "Pixel-to-Pixel Isolation by Deep Trench Technology: Application to CMOS Image Sensor." ISW 2011 Conference at Hokkaido, Japan. Published in 2011.

Non-Final Office Action dated Mar. 9, 2020 for U.S. Appl. No. 16/364,508.

Notice of Allowance dated Jul. 30, 2020 for U.S. Appl. No. 16/364,508.

Non-Final Office Action dated Jun. 2, 2022 for U.S. Appl. No. 17/070,543.

Notice of Allowance dated Nov. 2, 2022 for U.S. Appl. No. 17/070,543.

* cited by examiner

200D

300

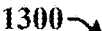

1300

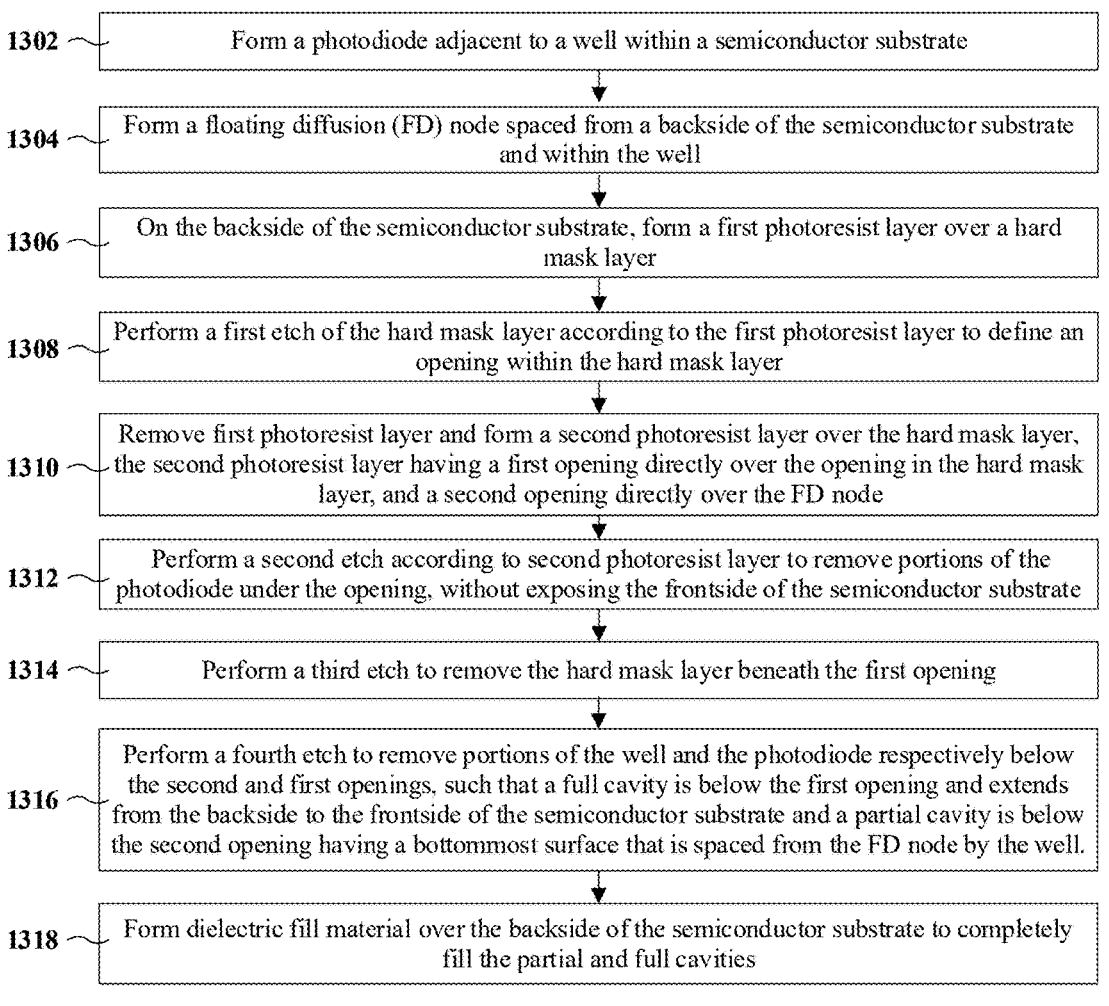

1302 — Form a photodiode adjacent to a well within a semiconductor substrate

1304 — Form a floating diffusion (FD) node spaced from a backside of the semiconductor substrate and within the well 1306 — On the backside of the semiconductor substrate, form a first photoresist layer over a hard mask layer 1308 — Perform a first etch of the hard mask layer according to the first photoresist layer to define an opening within the hard mask layer 1310 — Remove first photoresist layer and form a second photoresist layer over the hard mask layer, the second photoresist layer having a first opening directly over the opening in the hard mask layer, and a second opening directly over the FD node 1312 — Perform a second etch according to second photoresist layer to remove portions of the photodiode under the opening, without exposing the frontside of the semiconductor substrate 1314 — Perform a third etch to remove the hard mask layer beneath the first opening 1316 — Perform a fourth etch to remove portions of the well and the photodiode respectively below the second and first openings, such that a full cavity is below the first opening and extends from the backside to the frontside of the semiconductor substrate and a partial cavity is below the second opening having a bottommost surface that is spaced from the FD node by the well.

1318 — Form dielectric fill material over the backside of the semiconductor substrate to completely fill the partial and full cavities

Fig. 13

PHOTO DIODE WITH DUAL BACKSIDE DEEP TRENCH ISOLATION DEPTH

REFERENCE TO RELATED APPLICATIONS

This Application is a Continuation of U.S. application Ser. No. 17/070,543, filed on Oct. 14, 2020, which is a Continuation of U.S. application Ser. No. 16/364,508, filed on Mar. 26, 2019 (now U.S. Pat. No. 10,854,647, issued on Dec. 1, 2020), which claims the benefit of U.S. Provisional Application No. 62/773,324, filed on Nov. 30, 2018. The contents of the above-referenced Patent Applications are hereby incorporated by reference in their entirety.

BACKGROUND

Many modern day electronic devices, such as digital cameras and video cameras, contain image sensors to convert optical images to digital data. To achieve this, an image sensor comprises an array of pixel regions. Each pixel region contains a photodiode configured to capture optical signals (e.g., light) and convert it to digital data (e.g., a digital image). Complementary metal-oxide-semiconductor (CMOS) image sensors are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 illustrates a flow diagram of some embodiments of a method of forming a pixel sensor having a plurality of pixel regions separated from one another by partial and full BDTI regions.

DETAILED DESCRIPTION

Figure 1:
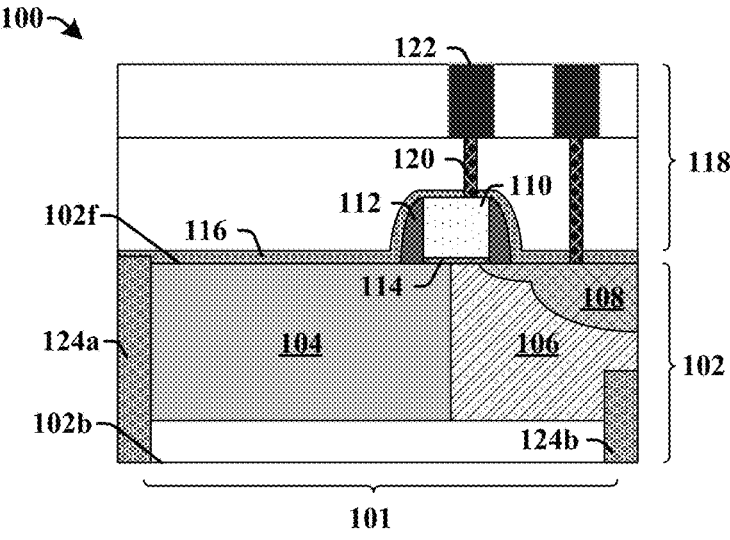
FIG. 1 illustrates a cross-sectional view of some embodiments of an image sensor having a pixel region with a full backside deep trench isolation (BDTI) structure and a partial BDTI structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may include a plurality of pixel regions arranged in an array having rows and columns. A first pixel region of the array comprises a first photodiode. In a complementary metal-oxide-semiconductor (CMOS) image sensor, a first transfer transistor is between the first photodiode and a floating diffusion (FD) node. The first photodiode is configured to convert incident light to charge carriers and the first transfer transistor is configured to transfer the charge carriers to the FD node. Adjacent to the first pixel region is a second pixel region. In a shared pixel layout structure, the second pixel region comprises a second transfer transistor arranged between a second photodiode and the FD node. The FD node is coupled to a plurality of transistors (e.g., a reset transistor, a source follower transistor, etc.) in a pixel device region.

Sharing a plurality of pixel regions between a same FD node decreases a footprint size of the image sensor on an integrated circuit because adjacent pixel regions are arranged close to one another. However, by arranging pixel regions close to one another, the image sensor is at risk for optical and electrical cross-talk. An example of optical cross-talk is when optical data (e.g., light) enters a pixel region at an angle and crosses into an adjacent pixel region. An example of electrical cross-talk is when charge carriers in a photodiode migrate to an adjacent photodiode.

To prevent cross-talk, adjacent pixel regions are isolated from one another. Shallow trench isolation (STI) structures may be used to isolate adjacent pixel regions, but STI structures do not extend completely through the substrate and thus provide for relatively poor isolation between adjacent pixel regions. Alternatively, full backside deep trench isolation (BDTI) structures may be used to isolate adjacent pixel regions from one another. A full BDTI structure may extend completely through the substrate and thus provides for good electrical and optical isolation.

However, in an image sensor with a shared pixel layout structure, an FD node is arranged between adjacent pixel regions, so that a full BDTI structure separating the adjacent pixel regions may vertically extend to touch the FD node. If the BDTI structure touches the FD node, defects along an edge of the full BDTI structure may provide for leakage paths that put the image sensor at risk for significant current leakage and reduction in pixel resolution. Further, the etch rate of an etching process used to form the full BDTI structure cannot be well controlled beneath the FD node since the FD node is arranged at a crossroad between BDTI trenches extending in different directions. For example, a size of a backside trench increases at the crossroad (due to corner rounding), allowing more etchant into the trench and increasing an etching rate at the crossroad. Thus, the full BDTI structure still may touch the FD node even with well controlled etching. Therefore, if full BDTI structures are used for pixel region isolation, a more spread out layout is often used where each pixel region has its own FD node that is laterally separated from the full BDTI structures.

In some embodiments, the present disclosure relates to an image sensor with a shared pixel layout structure (having two photodiodes sharing a same FD node) that is configured provide for optimal electrical and optical isolation between adjacent pixel regions, and an associated method of manufacturing. The image sensor utilizes a dual BDTI structure, which includes both partial and full BDTI structures. The partial BDTI structures are located beneath a floating diffusion (FD) node that is shared between a first photodiode and a second photodiode. The partial BDTI extends from a backside of a substrate to a position that is separated from the FD node. The full BDTI structures are located outside of the FD node and extend between opposing sides of the substrate. Using the partial BDTI structure over the FD node mitigates leakage paths from the FD node, while using the full BDTI structures outside of the FD node provides for better isolation between adjacent pixel regions.

FIG. 1 illustrates a cross-sectional view 100 of some embodiments of an integrated chip having a pixel region comprising a partial and full, or dual, backside deep trench isolation (BDTI) structure.

The pixel region 101 in cross-sectional view 100 includes a photodiode 104 within a semiconductor substrate 102 having a first doping type. In some embodiments, the photodiode 104 has a first region having a first doping type (e.g., n-type or p-type) and a second region having a second doping type (e.g., p-type or n-type). In some embodiments, the photodiode 104 extends from a frontside of the semiconductor substrate 102*f* to a backside of the semiconductor substrate 102*b*. In other embodiments, the photodiode 104 is spaced from the frontside of the semiconductor substrate 102*f* and/or the backside of the semiconductor substrate 102*b*. A floating diffusion (FD) node 108 is arranged along the front-side of the semiconductor substrate 102*f* at a position that is separated from the photodiode 104. The FD node 108 has the first doping type. In some embodiments, the FD node 108 has a higher doping concentration than the photodiode 104. The FD node 108 is spaced from the backside of the semiconductor substrate 102*b*.

In some embodiments, adjacent to the photodiode 104 is a well 106 that has a second doping type different than the first doping type. In some embodiments, the well 106 may be arranged between the FD node 108 and the photodiode 104. In other embodiments, the well 106 may be arranged between the FD node 108 and the backside of the semiconductor substrate 102*b*.

On the frontside of the semiconductor substrate 102*f* and overlying portions of the photodiode 104, well 106, and/or FD node 108 lies a gate oxide 114. Above the gate oxide 114 is a transfer gate electrode 110, and beside the gate oxide 114 and the transfer gate electrode 110 is a gate sidewall spacer 112. An etch stop layer 116 covers the frontside of the semiconductor substrate 102*f* and the transfer gate electrode

110. Inter-layer dielectric (ILD) layers 118 are on the etch stop layer 116, and conductive contacts 120 and metal interconnect wires 122 are embedded in the ILD layers 118 and coupled to the transfer gate electrode 110.

Isolation structures are arranged along opposing sides of the pixel region 101. In some embodiments, the isolation structures comprise a full backside deep trench isolation (BDTI) structure 124*a* and a partial BDTI structure 124*b*. The full BDTI structure 124*a* borders a side of the photodiode 104 to fully isolate the pixel region 101 from adjacent pixel regions. The full BDTI structure 124*a* extends from the backside of the semiconductor substrate 102*b* to the frontside of the semiconductor substrate 102*f*. In some embodiments, the full BDTI structure 124*a* extends past the frontside of the semiconductor substrate 102*f* and into the etch stop layer 116. In some embodiments the photodiode 104 directly contacts the full BDTI structure 124*a*. In other embodiments, the photodiode 104 is spaced from the full BDTI structure 124*a* by the well 106.

The partial backside deep trench isolation (BDTI) structure 124*b* is disposed directly under a portion of the FD node 108. The partial BDTI structure 124*b* is spaced apart from the FD node 108 by a portion of the well 106. The partial BDTI structure 124*b* has a height that is less than the full BDTI structure 124*a*. In some embodiments, the full BDTI structure 124*a* and the partial BDTI structure 124*b* comprise the same fill material. The fill material provides electrical and optical isolation between shared pixel regions and may be a dielectric such as silicon dioxide, silicon nitride, silicon carbide, or the like. In many embodiments, the backside surfaces of the full BDTI structure 124*a*, the partial BDTI structure 124*b*, the photodiode 104, and the well 106 are substantially co-planar with one another.

During operation, incident radiation hits the backside of the semiconductor substrate 102*b* and passes from the backside of the semiconductor substrate 102*b* to the photodiode 104. The photodiode 104 is configured to convert the incident radiation (e.g., photons) into an electric signal (i.e., to generate electron-hole pairs from the incident radiation). Having the partial BDTI structure 124*b* directly over the FD node 108 prevents leakage of the electrical signal from the FD node 108, while using the full BDTI structure 124*a* outside of the FD node 108 provides for better isolation between the pixel region 101 and an adjacent pixel region.

Figure 2A:
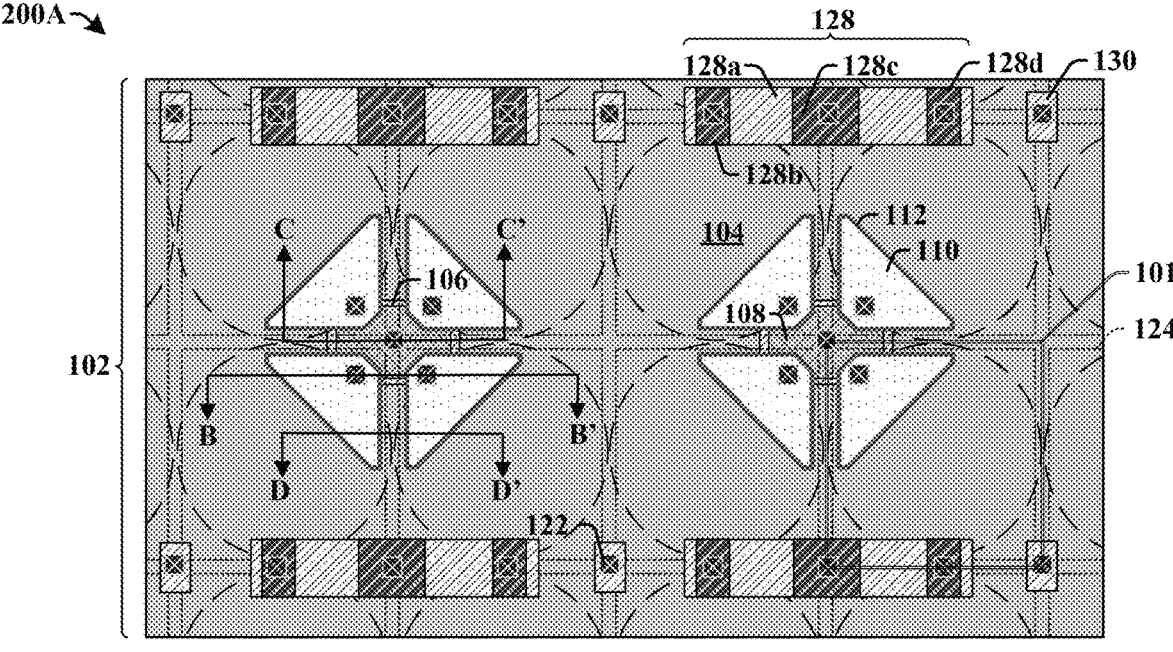
FIG. 2A illustrates a top view of some embodiments of an image sensor having a plurality of pixel regions separated by full and partial BDTI structures.

FIG. 2A illustrates a top view 200A of some embodiments of an image sensor comprising a plurality of pixel regions, separated from one another by BDTI structures of varying depths. The top view 200A in FIG. 2A is representative of the frontside of the semiconductor substrate 102*f*, except the ILD layers 118 and etch stop layer 116 are not shown.

As shown in FIG. 2A, the image sensor comprises a plurality of pixel regions 101. Each pixel region 101 comprises a transfer gate electrode 110 and a photodiode 104. In some embodiments, as shown, four pixel regions 101 share a FD node 108. In some embodiments, the FD node 108 is arranged within a well 106, such that from the top view 200A, outer portions of the well 106 are visible.

In addition, each FD node 108 is coupled to a pixel device region 128 by way of overlying conductive interconnect layers (not shown). The pixel device region 128 comprises a reset transistor 128*b*, a source follower transistor 128*c*, and a row-select transistor 128*d* disposed over a doped well region 128*a* in the semiconductor substrate 102. In some embodiments, the doped well region 128*a* has the second doping type. In some embodiments, adjacent transistors in the pixel device region 128, such as the reset transistor 128*b* and the source follower transistor 128*c*, may have a common source/drain region defined by the doped well region 128a. Beside each pixel device region 128 is a pick-up well region 130, which functions to give an overlying conductive contact a low resistance connection to the semiconductor substrate 102. In some embodiments, the pick-up well region 130 is spaced from the pixel device region 128. In other embodiments (not shown), the pick-up well region 130 may be directly adjacent to the pixel device region 128. The pixel device region 128 is spaced from the transfer gate electrodes 110, but their exact arrangement amongst pixel regions 131 may vary from what is depicted in FIG. 2A.

Each transfer gate electrode 110 overlaps the FD node 108, the well 106, and/or the photodiode 104. In some embodiments, the transfer gate electrode 110 may have a triangular shape from a top-view perspective of the frontside of the semiconductor substrate 102f. The transfer gate electrode 110 may comprise, for example, doped polysilicon, a conductive metal (e.g., aluminum), or the like. The gate oxide 114 may comprise a high-k dielectric, an oxide (e.g., such as silicon dioxide), or the like. The gate electrodes and gate oxides of the transistors 128b-128d in the pixel device region 128 may also respectively comprise the same materials as the transfer gate electrode 110 and the gate oxide 114.

A dual BDTI structure 124 extends from the backside of the semiconductor substrate 102b and comprises a partial BDTI structure 124b and a full BDTI structure 124a. The partial BDTI structure 124b underlies the pixel device region 128, the pick-up well region 130, the FD node 108, and the well 106. In some embodiments, the partial BDTI structure 124b is laterally between the pixel device region 128 and the pick-up well region 130 due to manufacturing conveniences. The pixel device region 128 and the pick-up well region 130 are isolated from adjacent pixel regions 101 by the partial BDTI structure 124b. The partial BDTI structure 124b does not directly contact the source/drain regions and pick-up well region 130. The full BDTI structure 124a borders other sides of each pixel region 101 that are not already bordered by a partial BDTI structure 124b. Thus, each pixel region 101 is isolated, either partially or fully, from adjacent pixel regions.

Figure 2B:
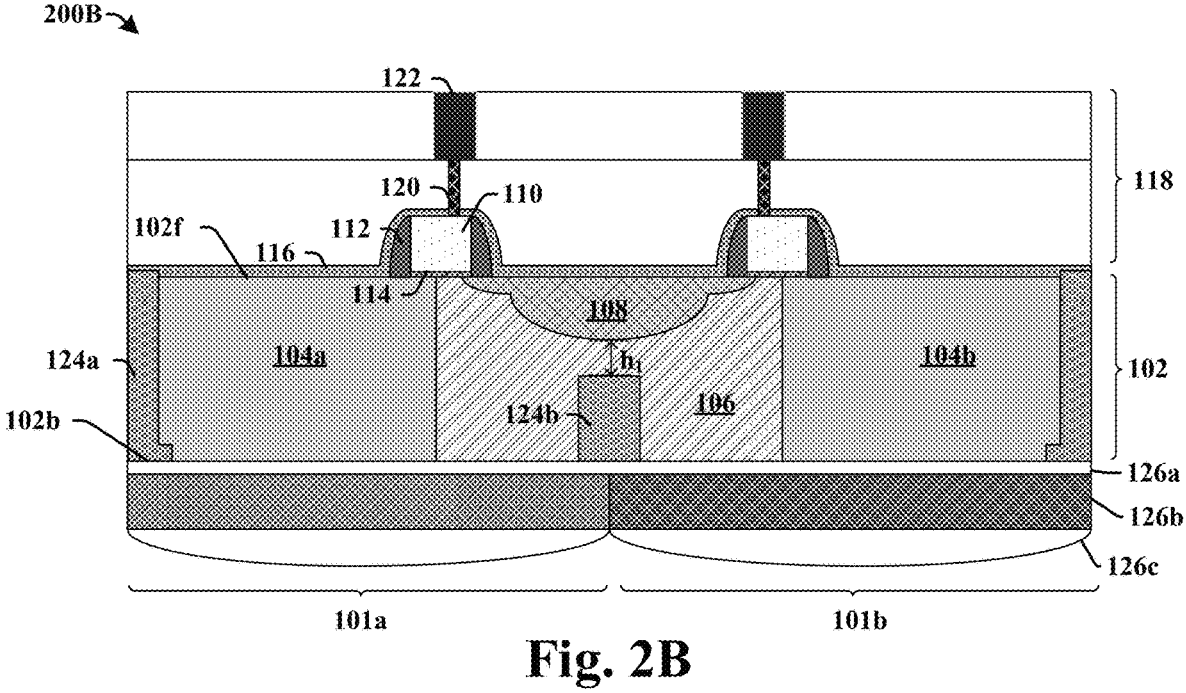
FIG. 2B illustrates a cross-sectional view of some embodiments of adjacent pixel regions sharing a floating diffusion region and separated from one another by a partial BDTI structure.

FIG. 2B illustrates a cross-sectional view 200B of some embodiments of adjacent pixel regions in an image sensor isolated by a dual BDTI structure. The cross-sectional view 200B is taken along the line B-B' of FIG. 2A.

A first pixel region 101a and a second pixel region 101b respectively comprise a first photodiode 104a and a second photodiode 104b. The first pixel region 101a is adjacent to the second pixel region 101b. The first and second pixel regions, 101a and 101b, share the FD node 108. In some embodiments, the FD node 108 may be shallower at its outer edges than in the center. In other embodiments (not shown), the FD node 108 may have a more consistent depth from the frontside of the semiconductor substrate 102f. Below the FD node 108, within the well 106, and between the first photodiode 104a and the second photodiode 104b is the partial BDTI structure 124b. The partial BDTI structure 124b is spaced at substantially equal distances from the first photodiode 104a and the second photodiode 104b. Thus, a line bisecting the partial BDTI structure 124b that is perpendicular to the backside of the semiconductor substrate 102b divides the FD node 108 into substantially even parts for sharing of the FD node 108 amongst the first pixel region 101a and the second pixel region 101b. In some embodiments, the partial BDTI structure 124b is spaced from the FD node 108 by the well 106. A height $h_1$ between the FD node 108 and the partial BDTI structure 124b may be in a range of between approximately 1 micrometer and approximately 2 micrometers to prevent leakage from the FD node 108 while still providing optical and electrical isolation between the first pixel region 101a and the second pixel region 101b. A width of the partial BDTI structure 124b may be in a range of between approximately 0.1 micrometers and approximately 0.15 micrometers. The full BDTI structure 124a is spaced from the partial BDTI structure 124b. The full BDTI structure 124a borders sides of the first photodiode 104a and the second photodiode 104b that are opposite to the sides of the first photodiode 104a and the second photodiode 104b that are adjacent to the FD node 108. In some embodiments, the full BDTI structure 124a has a larger width at the backside of the semiconductor substrate 102b than at the front side of the semiconductor substrate 102f.

In some embodiments, an anti-reflection layer 126a, color filters 126b, and a micro-lens 126c are arranged along the backside of the semiconductor substrate 102b. The micro-lens 126c is configured to focus light to an underlying one of the photodiodes 104a-104b, which generates electrical charges based upon the received light. When a voltage is applied to the transfer gate electrode 110, accumulated charge is transferred from the underlying one of the photodiodes 104a, 104b to the FD node 108. The light and accumulated charges are mostly contained within the pixel region without entering into an adjacent pixel region due to the presence of the full BDTI structure 124a and the partial BDTI structure 124b.

Figure 2C:
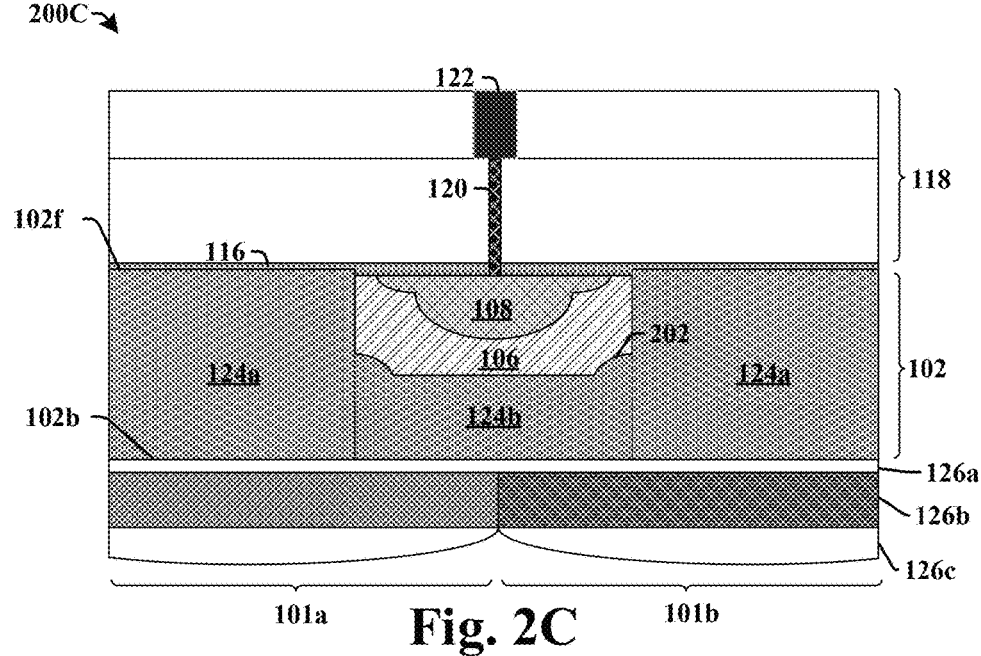
FIG. 2C illustrates an additional cross-sectional view of some embodiments of adjacent pixel regions sharing a floating diffusion region, where the partial and full BDTI structures are in contact with one another.

FIG. 2C illustrates a cross-sectional view 200C of some embodiments between adjacent pixel regions in an image sensor, comprising a dual BDTI structure. The cross-sectional view 200C is taken along the line C-C' of FIG. 2A.

From the perspective of cross-sectional view 200C, the full BDTI structure 124a directly contacts the partial BDTI structure 124b. In addition, the partial BDTI structure 124b directly underlies and spans across the width of the FD node 108. The partial BDTI structure 124b has a height that is substantially the same throughout its length. However, due to effects of corner rounding at the crossroads of the partial and full BDTI structures, in some embodiments, rounded corners 202 may be present at the corners where the full BDTI structure 124a and the partial BDTI structure 124b meet. The length of the partial BDTI structure 124b is dependent upon the size of the FD node 108. In some embodiments, the conductive contacts 120 and metal interconnect wiring 122 embedded within the ILD layers 118 are arranged over the FD node 108.

Figures 2D, 3:
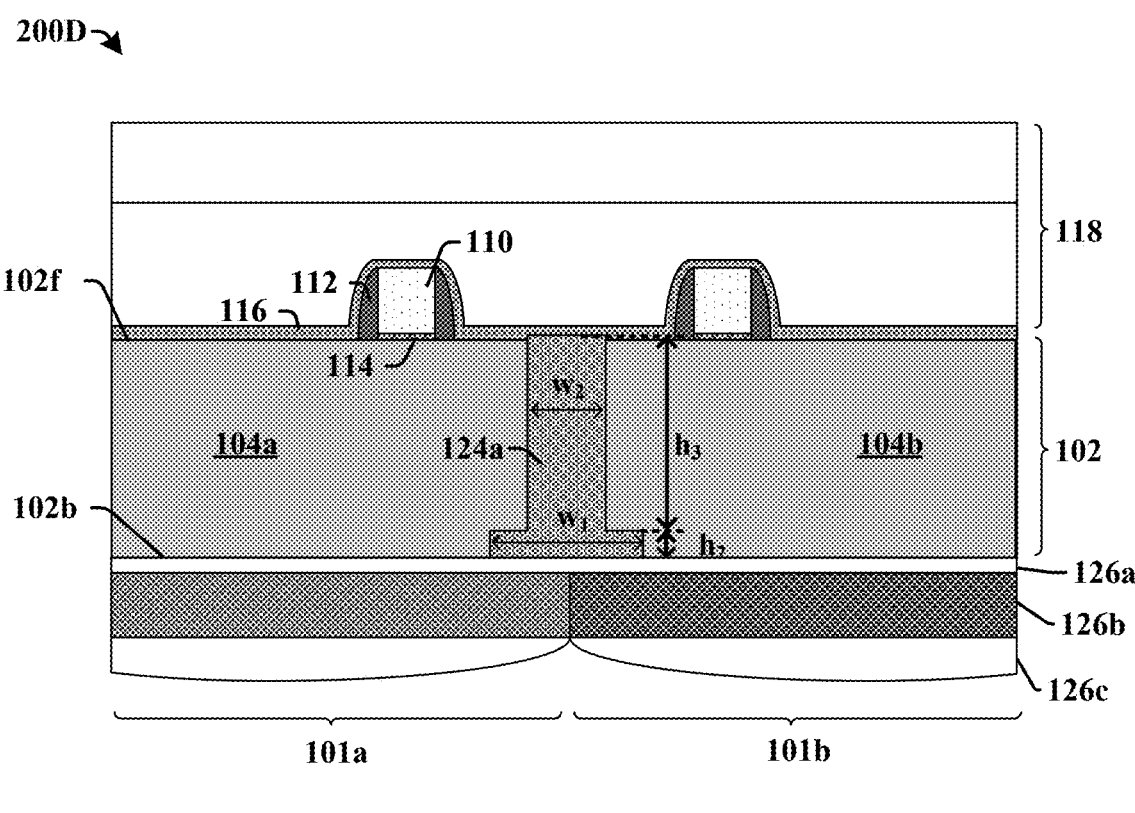
FIG. 2D illustrates an additional cross-sectional view of some embodiments of adjacent pixel regions sharing a floating diffusion region and separated from one another by a full BDTI structure.
FIGS. 3-12B illustrate cross-sectional and top views of some embodiments of a method of forming a pixel sensor having pixel regions that share FD nodes and are isolated from one another by partial and full BDTI regions.

FIG. 2D illustrates a cross-sectional view 200D of some embodiments between adjacent pixel regions in an image sensor, spaced apart by a full BDTI structure. The cross-sectional view 200D is taken along the line D-D' of FIG. 2A.

The full BDTI structure 124a is arranged at substantially equal distances between the transfer gate electrodes 110 of the first and second pixel regions 132,134. In some embodiments, first width $w_1$ of the full BDTI structure 124a at the backside of the semiconductor substrate 102b is larger than the second width $w_2$ of the full BDTI structure 124a at the frontside of the semiconductor substrate 102f. In most embodiments, the second height $h_2$ of the full BDTI structure 124a is less than the third height $h_3$ of the full BDTI structure 124a. In some embodiments, the second width $w_2$ is in a range of between approximately 0.1 micrometers and approximately 0.15 micrometers. The total height $(h_2+h_3)$ of the full BDTI structure 124a is at least equal to the height of the semiconductor substrate 102. In some embodiments, the total height (h$_2$+h$_3$) of the full BDTI structure 124*a* is in a range of between approximately 8 micrometers and approximately 10 micrometers.

FIGS. 3-12B illustrate cross-sectional views 300-1200B of some embodiments of a method of forming an image sensor in a shared pixel layout having full and partial BDTI structures isolating adjacent pixel regions from one another. Although FIGS. 3-12B are described in relation to a method, it will be appreciated that the structures disclosed in FIGS. 3-12B are not limited to such a method, but instead may stand alone as structures independent of the method.

As shown in cross-sectional view 300 of FIG. 3, a semiconductor substrate 102 is provided. The semiconductor substrate 102 may comprise any type of semiconductor body having a frontside 102*f* and a backside 102*b* (e.g., silicon wafer, SiGe wafer, etc.). In some embodiments, semiconductor substrate 102 has a first doping type. A well 106 having a second doping type may be formed within the semiconductor substrate 102 by performing a first implantation process to implant a first dopant species into the semiconductor substrate 102. A photodiode 104 may be formed by subsequently implanting one or more additional dopant species into the frontside 102*f* of the semiconductor substrate 102. For example, the photodiode 104 may be formed by selectively performing a second implantation process (e.g., according to a masking layer) to form a first region 105*a* having a first doping type (e.g., n-type), and subsequently performing a third implantation process to form a second region 105*b* abutting the first region 105*a* and having a second doping type (e.g., p-type) different than the first doping type.

Figure 4:
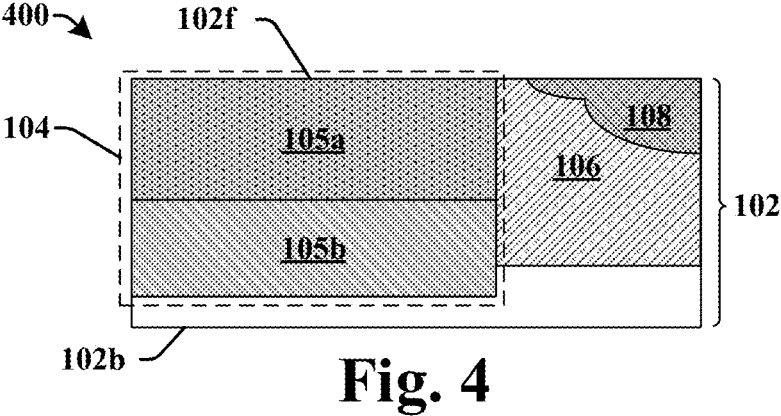

As shown in cross-sectional view 400 of FIG. 4, a floating diffusion (FD) node 108 is formed by doping a portion of the semiconductor substrate 102 from the frontside of the semiconductor substrate 102*f* to have the first doping type. In some embodiments, the FD node 108 has a higher doping concentration than the photodiode 104. In some embodiments, the depth of the FD node 108 varies throughout its length. The FD node 108 is doped to a depth that is spaced from the backside of the semiconductor substrate 102*b*. A portion of the well 106 separates the FD node 108 from the photodiode 104. In some embodiments the FD node 108 may be formed using one of the second or third implantation processes used to form the photodiode 104.

Figure 5A:
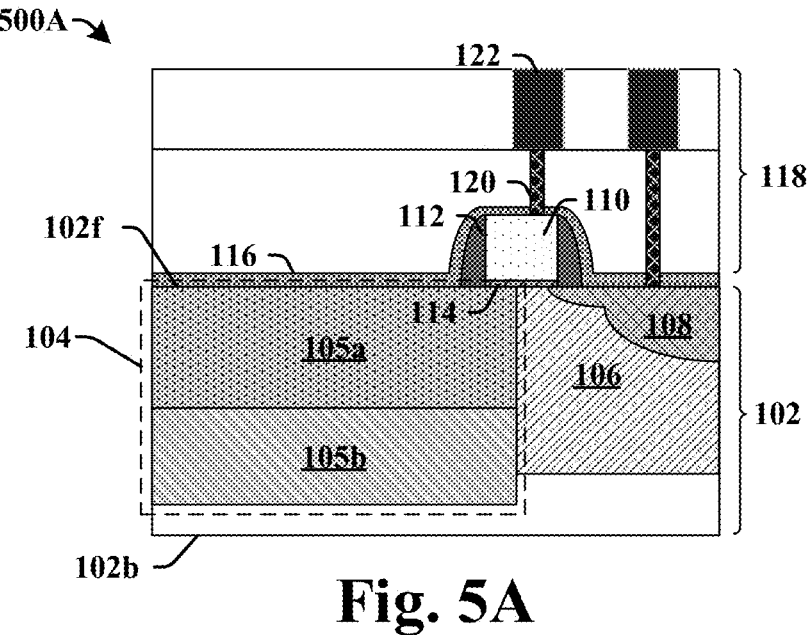

As shown in cross-sectional view 500A of FIG. 5A, on the frontside of the semiconductor substrate 102*f*, a transfer transistor is fabricated by, in some embodiments, a deposition of materials and subsequent photolithography and etching processes. The transfer transistor comprises a transfer gate electrode 110 formed over a gate oxide 114. Gate sidewall spacers 112 are formed beside the transfer gate electrode 110. The transfer gate electrode 110 is formed such that it directly overlies portions of the photodiode 104, the well 106, and/or the FD node 108. After the formation of the transfer transistor, an etch stop layer 116 is formed over the frontside of the semiconductor substrate 102*f*. In some embodiments, the etch stop layer 116 may comprise a nitride (e.g., silicon nitride), a carbide (e.g., silicon carbide), or the like. Conductive contacts 120 and metal interconnect wires 122 are then formed within inter-layer dielectric (ILD) layers on the frontside of the semiconductor substrate 102*f*. The conductive contacts 120 and metal interconnect wires 122 are coupled to the transfer gate electrode 110 and the FD node 108. In many embodiments, the conductive contacts 120 and metal interconnect wires 122 comprise conductive metals such as tungsten, aluminum, copper, or the like. In many embodiments, the conductive contacts 120 and metal interconnect wires 122 are formed by a damascene process (e.g., a single damascene process or a dual damascene process).

Figure 5B:
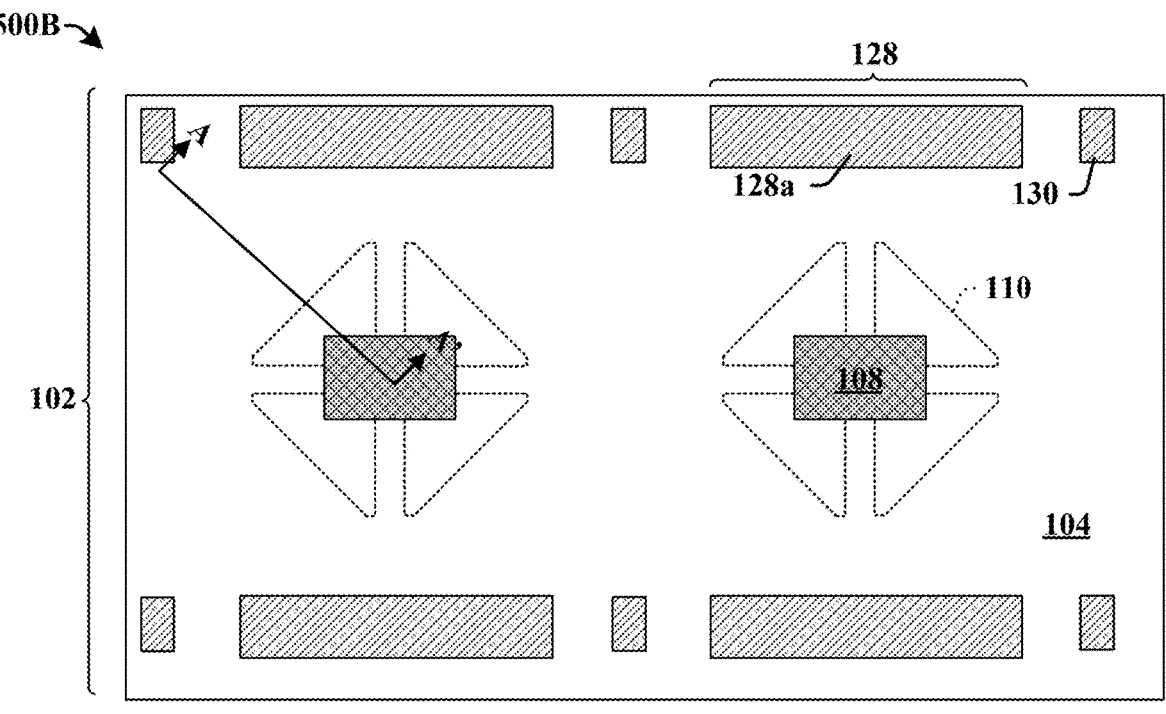

In FIG. 5B, a top view 500B from the backside of the semiconductor substrate 102*b* is shown. The cross-sectional view 500A of FIG. 5A is taken along line A-A' in top view 500B. Profiles of the transfer gate electrodes 110 are shown as being arranged around the FD node 108. In this embodiment, four transfer gate electrodes 110 overlie one FD node 108. In some embodiments, the transfer gate electrodes 110 may have a triangular layout from the top view 500B. Spaced from the FD node 108 and transfer gate electrode 110 are pixel device regions 128 and pick-up well regions 130. From the top view 500B, a doped well region 128*a*, which transistors of the pixel device regions 128 are disposed in, is seen. The doped well region 128*a*, the pick-up well region 130, and the well 106 have the same doping type (e.g., the second doping type). In some embodiments, the doped well region 128*a*, the pick-up well region 130, and the well 106 have different doping concentrations.

Figure 6:
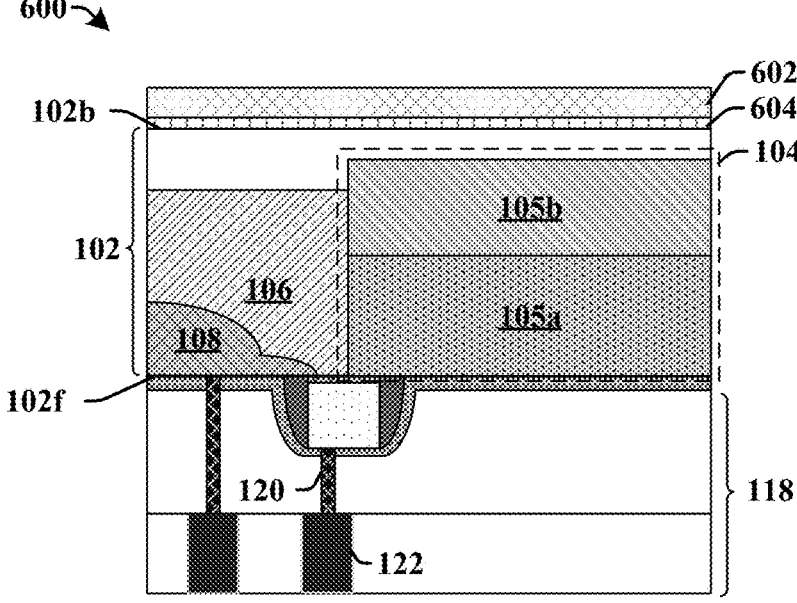

As shown in cross-sectional view 600 of FIG. 6, a hard mask layer 604 is formed over the backside of the semiconductor substrate 102*b*. The hard mask layer 604 has a substantially consistent thickness throughout its length. In some embodiments, the hard mask layer 604 may comprise silicon dioxide, silicon nitride, silicon oxynitride, titanium, tungsten, or the like. In some embodiments, the hard mask layer 604 has a thickness in a range of between approximately 100 angstroms and approximately 300 angstroms. A first photoresist layer 602 is formed over the hard mask layer 604. In some embodiments, the first photoresist layer 602 is deposited by a spin coating process.

Figures 7A, 7B:
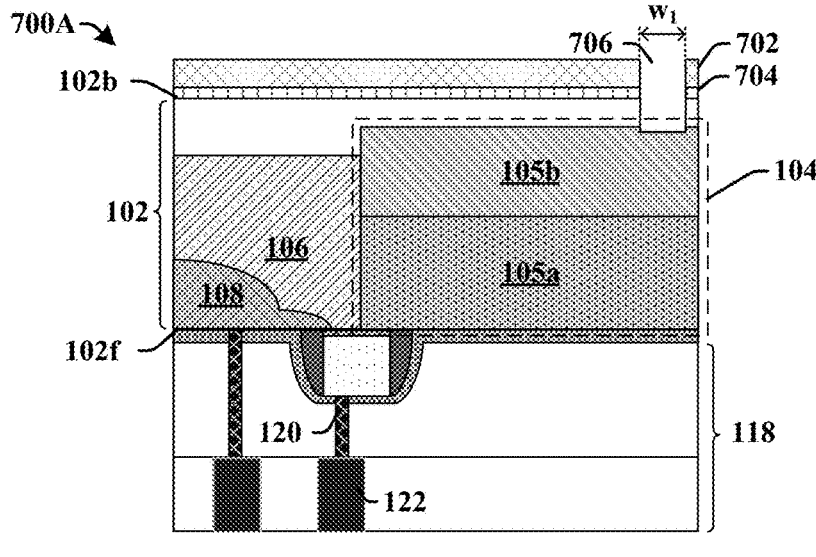

As shown in cross-sectional view 700A of FIG. 7A, the first photoresist layer (602 of FIG. 6) is patterned such that the patterned first photoresist layer 702 may be used as a mask to etch away the hard mask layer 604 and form an opening 706 in the hard mask layer 604. In some embodiments, the first photoresist layer (602 of FIG. 6) is patterned by being selectively exposed to electromagnetic radiation according to a photomask. Exposed regions of the first photoresist layer (602 of FIG. 6) become soluble and are dissolved, leaving behind the patterned first photoresist layer 702. A first etch (e.g., dry etch) using a first etchant is then performed, to etch through the hard mask layer (604 of FIG. 6) according to the patterned first photoresist layer 702, leaving behind a patterned hard mask layer 704 and exposing a first portion of the semiconductor substrate 102. The opening 706 in the hard mask layer (604 of FIG. 6) has a first width w$_1$. The opening 706 in the hard mask layer (604 of FIG. 6) directly overlies a portion of the photodiode 104 that is spaced from the well 106. In some embodiments, a small portion of the semiconductor substrate 102 is also removed during the first etch due to over etching. The patterned first photoresist layer 702 is then stripped (not shown).

In FIG. 7B, a top view 700B from the backside of the semiconductor substrate 102*b* is shown. The cross-sectional view 700A of FIG. 7A is taken along line A-A' in top view 700B. Exposed first portions of the photodiode 104 from the first etch are shown, while the rest of the backside of the semiconductor substrate 102*b* is covered with the patterned first photoresist layer 702.

Figure 8A:
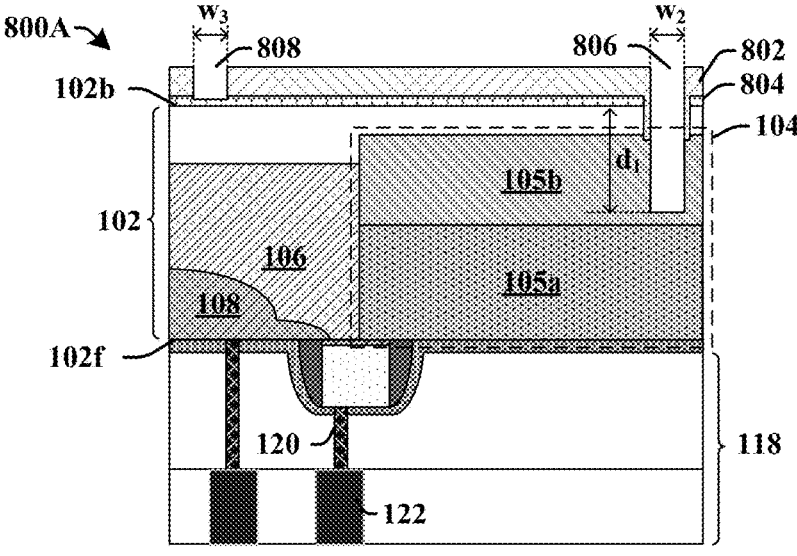

As shown in cross-sectional view 800A of FIG. 8A, a second photoresist layer is deposited and patterned using a second set of photolithography and etching steps, to form a patterned second photoresist layer 802. The patterned second photoresist layer 802 is over the backside of the semiconductor substrate 102*b* and the patterned hard mask layer

704. The patterned second photoresist layer 802 has two openings. A first opening 806 in the patterned second photoresist layer 802 has a second width $w_2$ and directly overlies the opening 706 in the hard mask layer (604 from FIG. 7A). A second opening 808 in the patterned second photoresist layer 802 has a third width $w_3$ and is centered directly over the FD node 108. In some embodiments, the second width $w_2$ is less than the first width $w_1$ of the opening 706 to prevent alignment problems. In other embodiments, the second width $w_2$ is substantially equal to the third width $w_3$.

A second etch (e.g., a dry etch) using a second etchant is performed, to etch into the semiconductor substrate 102 below the first opening 806. The second etch is stopped at a first distance $d_1$ from the backside of the semiconductor substrate 102b, which is spaced from the frontside of the semiconductor substrate 102f. In some embodiments, the patterned hard mask layer 804 may be thinned by removing a portion of the patterned hard mask layer 804 over the well 106 and below the second opening 808.

Figure 8B:
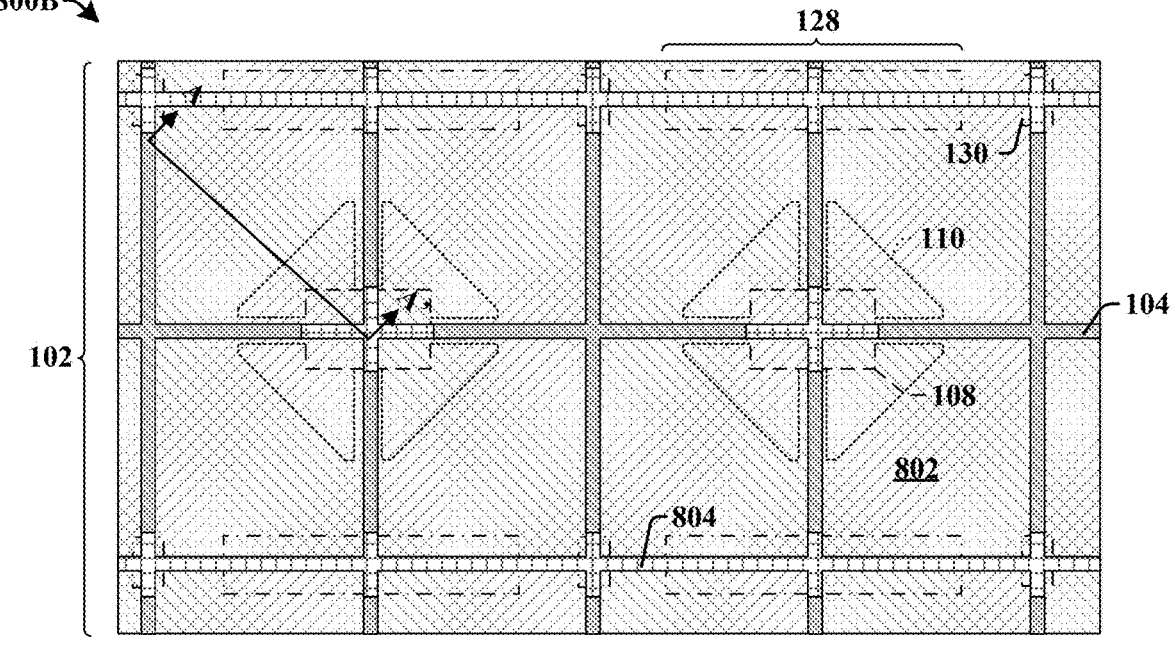

In FIG. 8B, a top view 800B from the backside of the semiconductor substrate 102b is shown. The cross-sectional view 800A of FIG. 8A is taken along line A-A' in top view 800B. Exposed first portions of the photodiode 104 from the second etch are shown. The exposed portions of the patterned hard mask layer 804 are shown. In some embodiments, the exposed portions of the patterned hard mask layer 804 are beneath the well 106, the pixel device region 128, and the pick-up well region 130, as well as laterally between the pick-up well region 130 and the pixel device region 128. In other embodiments (not shown), the exposed first portions of the photodiode 104 are laterally between the pixel device region 128 and the pick-up well region 130 instead of the exposed portions of the patterned hard mask layer 804.

As shown in cross-sectional view 900A of FIG. 9A, a third etch (e.g., dry etch) using a third etchant is performed to fully remove portions of the patterned hard mask layer 804 directly below the second opening 808, leaving the patterned hard mask layer 904. Although the third etchant is selective to the material of the patterned hard mask layer 804, small portions of the well 106 and the photodiode 104 respectively underlying the second opening 808 and the first opening 806 may also be removed. The first bottom surface 906 is below the first opening 806, and the second bottom surface 908 is below the second opening 808.

Figures 9A, 9B:
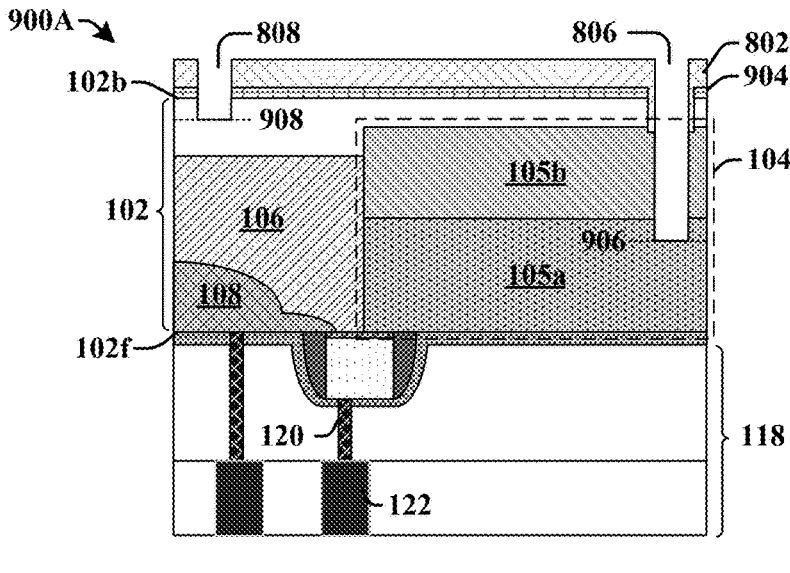

In FIG. 9B, a top view 900B from the backside of the semiconductor substrate 102b is shown. The cross-sectional view 900A of FIG. 9A is taken along line A-A' in top view 900B. The top view 900B is similar to the top view 800B of FIG. 8B, except, in top view 900B, the well 106 is exposed below the second openings 808 instead of the patterned hard mask layer 804 as in top view 800B.

Figure 10A:
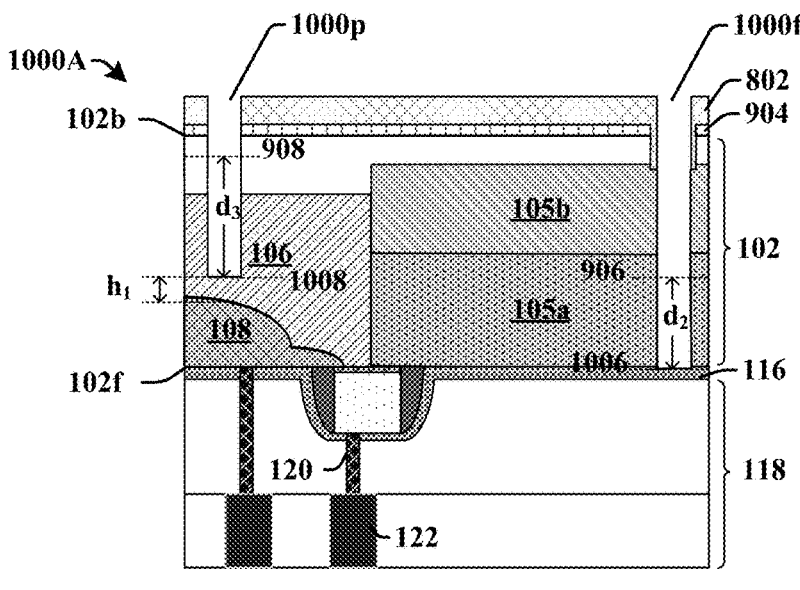

As shown in cross-sectional view 1000A of FIG. 10A, a fourth etch (e.g., dry etch) using a fourth etchant is performed according to the patterned second photoresist layer 802 to form a full cavity 1000f and a partial cavity 1000p. The fourth etchant is selective to the material of the semiconductor substrate 102. The full cavity 1000f extends from the backside of the semiconductor substrate 102b to the frontside of the semiconductor substrate 102f. In some embodiments, over etching occurs, and the full cavity 1000f extends into a portion of the etch stop layer 116. The full cavity 1000f has a third bottom surface 1006 that is at a second distance $d_2$ from the first bottom surface 906. The partial cavity 1000p extends into the well 106 to a fourth bottom surface 1008 that is at a third distance $d_3$ from the second bottom surface 908. The etch rate of the fourth etchant is the same on the well 106 and on the photodiode 104 because the well 106 and the photodiode 104 are both made of the material of the semiconductor substrate 102. Therefore, the second distance $d_2$ is substantially equal to the third distance $d_3$. The first through third etches must be properly conducted to appropriate depths such that when the fourth etch stops at the second distance $d_2$, the full cavity 1000f extends from the backside of the semiconductor substrate 102b to the frontside of the semiconductor substrate 102f, while the partial cavity extends from the backside of the semiconductor substrate 102b to the fourth bottom surface 1008 that is spaced from the FD node 108 by a first height $h_1$. The first height $h_1$ is a non-zero distance. In some embodiments, the first height may be in a range of between approximately 1 micrometer and approximately 2 micrometers.

Figure 10B:
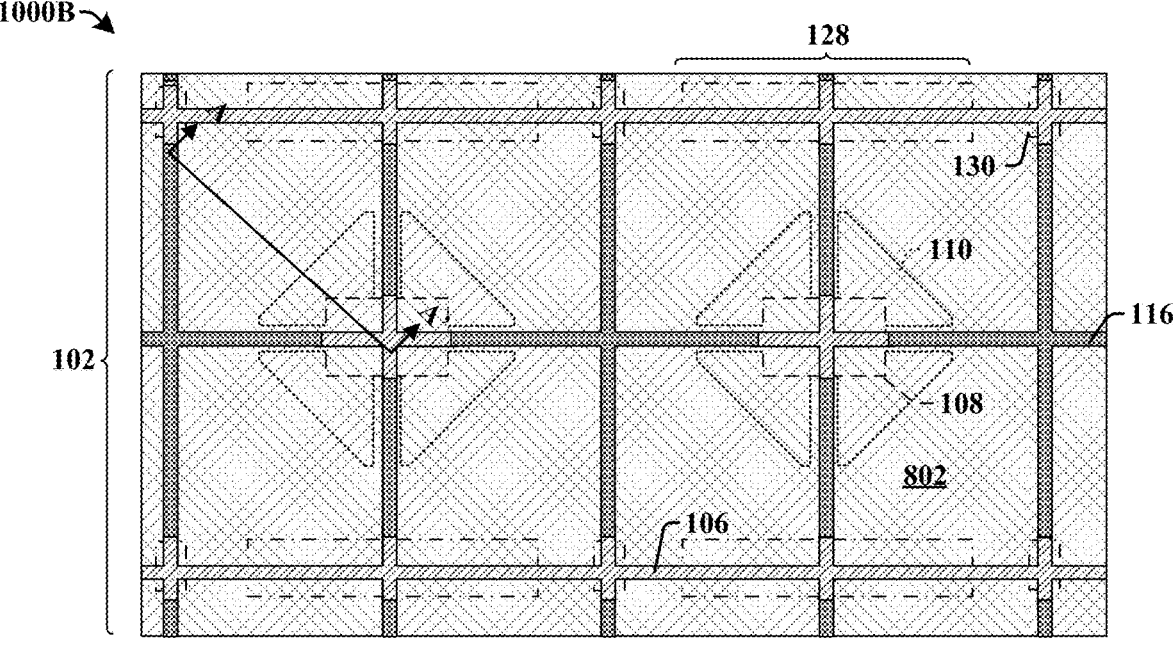

In FIG. 10B, a top view 1000B from the backside of the semiconductor substrate 102b is shown. The cross-sectional view 1000A of FIG. 10A is taken along line A-A' in top view 1000B. The top view 1000B is similar to the top view 900B of FIG. 9B, except, in top view 1000B, the etch stop layer 116 is exposed in the areas underlying the first openings 806 instead of the exposed first portions of the photodiode 104. In top view 1000B, portions of the well 106 that are exposed represent where partial BDTI structures 124b will lie, and portions of the etch stop layer 116 that are exposed represent where full BDTI structures 124a will lie.

Figure 11:
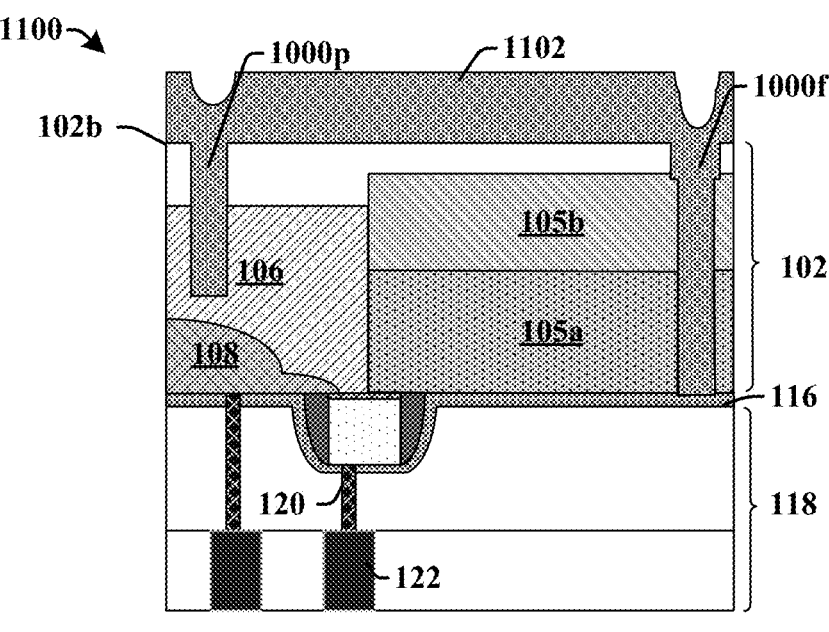

As shown in cross-sectional view 1100 of FIG. 11, in some embodiments, the patterned hard mask layer 904 and the patterned second photoresist layer 802 are removed from the backside of the semiconductor substrate 102b by a removal process such as planarization (e.g., chemical mechanical planarization) or chemical stripping. In other embodiments (not shown), the patterned hard mask layer 904 and the patterned second photoresist layer 802 may remain on the backside of the semiconductor substrate 102b and be removed during future planarization steps. A dielectric fill material 1102 is deposited over the backside of the semiconductor substrate 102b such that the partial cavity 1000p and the full cavity 1000f are both completely filled with the dielectric fill material 1102. In some embodiments, the dielectric fill material is an oxide (e.g., silicon dioxide).

Figure 12A:
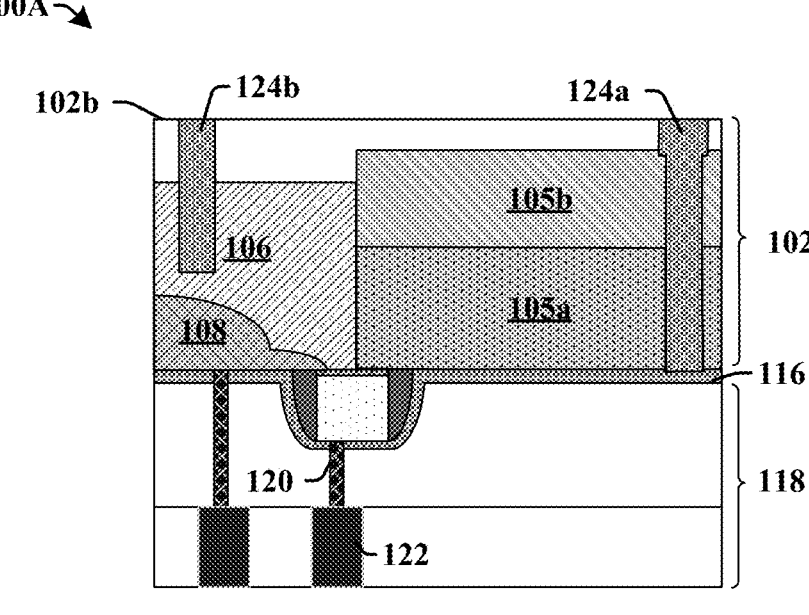

As shown in cross-sectional view 1200A of FIG. 12A, a planarization process is performed on the backside of the semiconductor substrate 102b to remove the dielectric fill material 1102. In some embodiments (not shown), where the patterned hard mask layer 904 and the patterned second photoresist layer 802 were not removed prior to depositing the dielectric fill material 1102, when the planarization process is performed on the backside of the semiconductor substrate 102b to remove the dielectric fill material 1102, the planarization process also removes the patterned hard mask layer 904 and the patterned second photoresist layer 802. After the planarization process, the remaining dielectric fill material 1102 forms the partial BDTI structure 124b and the full BDTI structure 124a. Backside surfaces of the well 106, the photodiode 104, the full BDTI structure 124a and the partial BDTI structure 124b are substantially coplanar. In some embodiments, the planarization process may remove the portion of the full BDTI structure 124a having the first width $w_1$, resulting in the embodiment such as cross-sectional view 100 of FIG. 1.

Figure 12B:
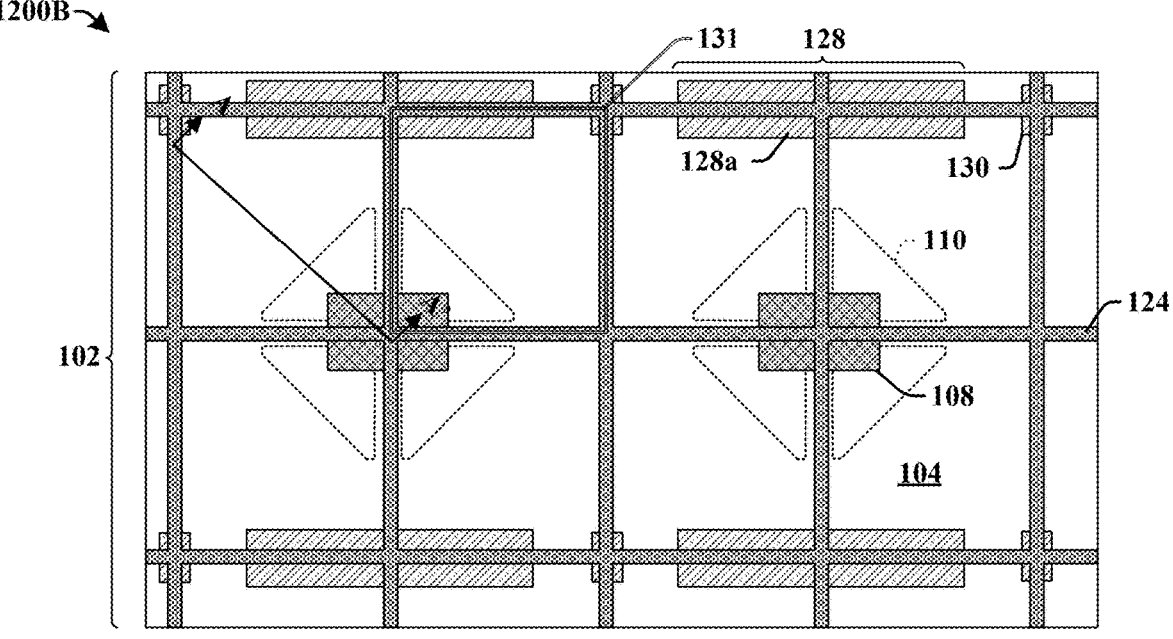

In FIG. 12B, a top view 1200B from the backside of the semiconductor substrate 102b is shown. The cross-sectional view 1200A of FIG. 12A is taken along line A-A' in top view 1200B. A pixel region 131 is isolated from other pixel regions by the dual BDTI structure 124, comprising the full BDTI structure 124a and the partial BDTI structure 124b.

In some embodiments, optical capturing elements 126 are then manufactured on the backside of the semiconductor substrate 102b, resulting in, for example, the embodiments illustrated in FIGS. 2A-2D.

FIG. 13 illustrates a flow diagram of some embodiments of a method 1300 of forming an image sensor with a dual BDTI structure.

While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a photodiode adjacent is formed adjacent to a well. FIG. 3 illustrates a cross-sectional view 300 of some embodiments corresponding to act 1302.

At 1304, a floating diffusion (FD) node is formed, which is spaced from a backside of the semiconductor substrate and within the well. FIG. 4 illustrates cross-sectional view 400 of some embodiments corresponding to act 1304.

At 1306, a first photoresist layer is formed over a hard mask layer on the backside of the semiconductor substrate. FIG. 6 illustrates cross-sectional view 600 of some embodiments corresponding to act 1306.

At 1308, a first etch is performed according to the first photoresist layer to define an opening within the hard mask layer. FIG. 7A and FIG. 7B respectively illustrate cross-sectional view 700A and top view 700B that correspond to act 1308.

At 1310, the first photoresist layer is removed and a second photoresist layer is formed over the hard mask layer. The second photoresist layer has a first opening directly over the opening in the hard mask layer and a second opening directly over the FD node.

At 1312, a second etch is performed according to the second photoresist layer to remove portions of the photodiode under the first opening, without exposing the frontside of the semiconductors substrate. FIG. 8A and FIG. 8B respectively illustrate cross-sectional view 800A and top view 800B that correspond to acts 1312.

At 1314, a third etch is performed to remove the hard mask layer beneath the second opening. FIG. 9A and FIG. 9B respectively illustrate cross-sectional view 900A and top view 900B that correspond to act 1314.

At 1316, a fourth etch is performed to remove portions of the well and the photodiode respectively below the second and first openings, respectively forming a partial cavity and a full cavity. The full cavity is below the first opening and extends from the backside to the frontside of the semiconductor substrate. The partial cavity is below the second opening and has a bottommost surface that is spaced from the FD node by the well. FIG. 10A and FIG. 10B respectively illustrate cross-sectional view 1000A and top view 1000B that correspond to act 1316.

At 1318, a dielectric fill material is formed over the backside of the semiconductor substrate to completely fill the partial and full cavities. The dielectric fill material forms a partial backside deep trench isolation (BDTI) structure and a full BDTI structure. FIG. 11 and FIG. 12A respectively illustrate cross-sectional views 1100 and 1200A that correspond to act 1318.

Therefore, the present disclosure relates to a new structure and corresponding method of an image sensor having pixel regions surrounded and isolated from one another by a dual BDTI structure, comprising partial BDTI structures and full BDTI structures.

Accordingly, in some embodiments, the present disclosure relates to an image sensor, including a first photodiode disposed in a semiconductor substrate; a second photodiode disposed in the semiconductor substrate; a floating diffusion node disposed along a frontside of the semiconductor substrate between the first photodiode and the second photodiode; a partial backside deep trench isolation (BDTI) structure disposed within the semiconductor substrate between the first photodiode and the second photodiode, and extending from a backside of the semiconductor substrate, wherein the partial BDTI structure is spaced from the floating diffusion node; and a full BDTI structure extending from the backside of the semiconductor substrate to the frontside of the semiconductor substrate.

In other embodiments, the present disclosure relates to image sensor, including a plurality of pixel regions disposed in a semiconductor substrate; a floating diffusion (FD) node extending into the semiconductor substrate from a frontside of the semiconductor substrate, wherein the FD node is shared amongst the plurality of pixel regions; a partial backside deep trench isolation (BDTI) structure extending from a backside of the semiconductor substrate, underlying the FD node, and spaced from the FD node; and a full BDTI structure extending from the backside of the semiconductor substrate to the frontside of the semiconductor substrate, wherein the plurality of pixel regions are laterally separated from one another by the full BDTI structure and partial BDTI structure.

In yet other embodiments, the present disclosure relates to a method for forming an image sensor, the method includes forming a photodiode within a substrate; forming a floating diffusion node along a frontside of the substrate and spaced apart from a backside of the substrate; forming a first patterned photoresist layer over a hard mask layer on the backside of the substrate; performing a first etch of the hard mask layer according to the first patterned photoresist layer to form a first opening in the hard mask layer over the photodiode; performing a second etch according to a second patterned photoresist layer to remove portions of the substrate under the first opening and to thin the hard mask layer over the floating diffusion node; performing a third etch to form a full cavity beneath the first opening and a partial cavity over the floating diffusion node, wherein the partial cavity is spaced from the floating diffusion node, and wherein the full cavity extends from the backside of the substrate to the frontside of the substrate; and filling the partial and full cavities with a fill material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:

a semiconductor substrate having a first side and a second side;

a doped region establishing a floating diffusion node disposed in the semiconductor substrate;

a photodiode disposed in the semiconductor substrate and spaced apart from the floating diffusion node;

a first trench isolation structure comprising a first portion and a second portion, the second portion underlying the first portion and having a greater width than the first portion, the first trench isolation structure partially laterally surrounding the photodiode as viewed from over the semiconductor substrate, and the first trench isolation structure having a first height extending from the first side of the semiconductor substrate and to the second side of the semiconductor substrate as viewed from a cross-section of the semiconductor substrate; and a second trench isolation structure underlying the doped region, the second trench isolation structure adjoining the first trench isolation structure such that the first and second trench isolation structures form a closed loop path that laterally surrounds the photodiode as viewed from over the semiconductor substrate, and the second trench isolation structure having a second height that is less than the first height as viewed from the cross-section of the semiconductor substrate.

2. The image sensor of claim 1, wherein the second trench isolation structure directly underlies the floating diffusion node.

3. The image sensor of claim 1, wherein the second trench isolation structure directly contacts a side of the first trench isolation structure.

4. The image sensor of claim 1, wherein the second trench isolation structure directly contacts the first trench isolation structure at a rounded corner.

5. The image sensor of claim 1, wherein the first portion of the first trench isolation structure directly contacts the second portion of the first trench isolation structure to form a stepped structure.

6. The image sensor of claim 5, wherein the second portion of the first trench isolation structure directly underlies the photodiode.

7. The image sensor of claim 1, wherein the second trench isolation structure has an upper surface spaced below a lowermost extent of the doped region.

8. An image sensor, comprising:

a semiconductor substrate having a first side and a second side;

a doped region establishing a floating diffusion node disposed along the first side of the semiconductor substrate;

a plurality of photodiodes laterally surrounding the floating diffusion node as viewed from over the semiconductor substrate;

a first trench isolation structure partially laterally surrounding the plurality of photodiodes as viewed from over the semiconductor substrate, the first trench isolation structure having a first height extending from the first side of the semiconductor substrate, through the semiconductor substrate, and to the second side of the semiconductor substrate as viewed in a cross-section of the semiconductor substrate; and a second trench isolation structure adjoining the first trench isolation structure to form a plurality of closed loops that laterally surround the plurality of photodiodes, respectively, as viewed from over the semiconductor substrate, the second trench isolation structure having a second height that is less than the first height;

wherein a widest portion of the first trench isolation structure is at a same height as the second trench isolation structure.

9. The image sensor of claim 8, wherein the second trench isolation structure directly underlies the floating diffusion node.

10. The image sensor of claim 8, wherein the second trench isolation structure directly contacts a side of the first trench isolation structure.

11. The image sensor of claim 8, wherein the second trench isolation structure directly contacts the first trench isolation structure at a rounded corner.

12. The image sensor of claim 8, wherein the first trench isolation structure has a first width along the first side of the semiconductor substrate and a second width along the second side of the semiconductor substrate, and wherein the second width is greater than the first width.

13. The image sensor of claim 12, wherein the second trench isolation structure has a third width along the second side of the semiconductor substrate, and wherein the third width is about equal to the first width of the first trench isolation structure.

14. The image sensor of claim 8, further comprising:

a first conductive gate structure disposed over the first side of the semiconductor substrate, and disposed proximate to a first edge of the doped region; and a second conductive gate structure disposed over the first side of the semiconductor substrate, and disposed proximate to a second edge of the doped region;

wherein the second trench isolation structure is disposed under the doped region and laterally between the first conductive gate structure and second conductive gate structure.

15. The image sensor of claim 14, wherein the second trench isolation structure has an upper surface spaced apart from a lowermost extent of the doped region.

16. The image sensor of claim 8, wherein the second trench isolation structure has an upper surface spaced apart from a lowermost extent of the doped region.

17. An image sensor, comprising:

a first photodiode disposed in a semiconductor substrate;

a second photodiode disposed in the semiconductor substrate, wherein an axis extends through the semiconductor substrate to laterally separate the first photodiode and the second photodiode;

a doped semiconductor region corresponding to a floating diffusion node disposed along a first side of the semiconductor substrate between the first photodiode and the second photodiode, wherein the floating diffusion node is intersected by the axis;

a first backside deep trench isolation (BDTI) structure extending from a second side of the semiconductor substrate to the first side of the semiconductor substrate; and a second BDTI structure disposed within the semiconductor substrate along the axis, laterally separating the first photodiode and the second photodiode, and extending from the second side of the semiconductor substrate, wherein the second BDTI structure directly underlies the floating diffusion node, and wherein the second BDTI structure directly contacts the first BDTI structure at a rounded corner.

18. The image sensor of claim 17, wherein the second BDTI structure has an upper surface spaced below a lowermost extent of the doped semiconductor region.

19. The image sensor of claim 17, further comprising:

a first conductive gate structure disposed over the first side of the semiconductor substrate, and disposed proximate to a first edge of the doped semiconductor region; and a second conductive gate structure disposed over the first side of the semiconductor substrate, and disposed proximate to a second edge of the doped semiconductor region;

wherein the second BDTI structure is disposed under the doped semiconductor region.

20. The image sensor of claim 19, wherein the first edge of the doped semiconductor region is laterally spaced apart from a first sidewall of the second BDTI structure, and wherein the second edge of the doped semiconductor region is laterally spaced apart from a second sidewall of the second BDTI structure.

\* \* \* \* \*